(12) United States Patent
Chu

(10) Patent No.: US 11,901,885 B2
(45) Date of Patent: Feb. 13, 2024

(54) PULSE WIDTH MODULATION-BASED OVERCURRENT PROTECTION CIRCUIT AND OPERATING METHOD FOR THE SAME

(71) Applicant: REALTEK SEMICONDUCTOR CORP., Hsinchu (TW)

(72) Inventor: Li-Cheng Chu, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 7 days.

(21) Appl. No.: 17/375,387

(22) Filed: Jul. 14, 2021

(65) Prior Publication Data

US 2022/0021382 A1   Jan. 20, 2022

(30) Foreign Application Priority Data

Jul. 16, 2020   (TW) .................................. 109124098

(51) Int. Cl.
*H03K 17/082* (2006.01)
*H02H 9/02* (2006.01)
*H02M 3/07* (2006.01)

(52) U.S. Cl.
CPC .......... *H03K 17/0822* (2013.01); *H02H 9/02* (2013.01); *H02M 3/07* (2013.01)

(58) Field of Classification Search
CPC ......... H03K 17/082–0828; H02H 9/02; H02H 9/025; H02M 3/07
See application file for complete search history.

(56) References Cited

U.S. PATENT DOCUMENTS

| 4,142,114 A * | 2/1979 | Green ................. H03K 17/145 |
| | | 327/536 |
| 7,714,555 B2 | 5/2010 | Lee |
| 2018/0048140 A1 * | 2/2018 | Takuma ................. G06F 1/305 |
| 2019/0393694 A1 * | 12/2019 | Venigalla ............ H02J 7/00304 |

FOREIGN PATENT DOCUMENTS

TW   200746583 A   12/2007

* cited by examiner

*Primary Examiner* — Jared Fureman
*Assistant Examiner* — Christopher J Clark
(74) *Attorney, Agent, or Firm* — Li & Cai Intellectual Property (USA) Office

(57) ABSTRACT

A PWM-based (pulse width modulation-based) overcurrent protection circuit and an operating method for the same are provided. The PWM-based overcurrent protection circuit includes a pulse-width-modulation circuit that is connected to a charge pump and a load detection circuit of a power-switch circuit. The charge pump outputs a voltage to the power-switch circuit according to a clock-voltage signal. The load detection circuit is used to detect an overcurrent flowing through the power-switch circuit according to a load at an output end of the power-switch circuit. Thus, when the load detection circuit detects the overcurrent, the pulse-width-modulation circuit controls a duty-cycle width of the charge pump, so as to suppress the voltage outputted by the charge pump. Therefore, an output voltage from the power-switch circuit can be corrected for preventing or reducing the overcurrent.

10 Claims, 6 Drawing Sheets

PULSE WIDTH MODULATION-BASED OVERCURRENT PROTECTION CIRCUIT AND OPERATING METHOD FOR THE SAME

CROSS-REFERENCE TO RELATED PATENT APPLICATION

This application claims the benefit of priority to Taiwan Patent Application No. 109124098, filed on Jul. 16, 2020. The entire content of the above identified application is incorporated herein by reference.
Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an overcurrent protection scheme, and more particularly to a protection circuit that is used to suppress an overcurrent in a power-control circuit by pulse width modulation and an operating method for the same.

BACKGROUND OF THE DISCLOSURE

An overcurrent protection circuit is often used in a power circuit of a modern electronic device. The overcurrent protection circuit is generally used to clamp the current flowing through the power circuit within a certain current range, so as to suppress the overcurrent in the circuit. Therefore, the overcurrent protection circuit is able to protect the circuit components from damage.

FIG. 1 is a schematic diagram depicting a power-switch circuit in a circuit system. With a control circuit of a USB Type-C as an example, a power-switch circuit 10 is in charge of controlling a current (ICC) between a power-source end (VCONN) of a source and a common collector (CC) of a sink that is a power consumption end. The power-switch circuit 10 uses a power MOS structure. In a power MOS, a large current may flow from the power-source end (VCONN) to the common collector circuit (CC) when the load of the sink exceeds an expected value. In this situation, an overcurrent protection device can be adopted to clamp the current flowing through the USB Type-C within a specific range.

The conventional overcurrent protection device uses a burst mode. When the current (ICC) flowing from the power-source end (VCONN) to the common collector (CC) exceeds a rated range, the overcurrent protection device issues an overcurrent protection voltage ($V_{OCP}$) that can be identified as 0 to 1. An output voltage ($V_{CP}$) of a charge pump 12 can be suppressed by adjusting a clock signal (CLK), so as to reduce the voltage at a gate end of the MOS in the power-switch circuit 10. Therefore, the current (ICC) can be reduced. However, the conventional overcurrent protection device may produce an extremely large output voltage ripple and may not be suitable for applications with high stability requirements.

With regard to changes of an output voltage ($V_{CS}$) when an overcurrent protection is performed in the burst mode, reference can be made to FIG. 2A. The corresponding clock signals in the burst mode are shown in FIG. 2B. FIG. 2C is a timing diagram when the overcurrent protection voltage ($V_{OCP}$) is generated.

In general, the charge pump 12 in the circuit provides the output voltage ($V_{CP}$), e.g., 10V voltage, to a gate end of the power switch according to clock-voltage signals ($V_{DUTY}$) that are periodically generated. When the overcurrent is detected, the burst mode is activated for overcurrent protection and the overcurrent protection voltage ($V_{OCP}$) is generated simultaneously. As FIG. 2C shows, the overcurrent protection voltage ($V_{OCP}$) is used to adjust the clock-voltage signal ($V_{DUTY}$). In FIG. 2B, the voltage provided to the gate end of the power switch by the charge pump 12 can be reduced. FIG. 2A shows the adjusted output voltage ($V_{CS}$) of the power switch. $V_{REF}$ is a reference voltage of the power switch, and a correction drop $\Delta V_1$ is shown.

A drawback of the conventional overcurrent protection performed in the burst mode is that when a hold time of the clock-voltage signal ($V_{DUTY}$) lasts too long, a large voltage ripple of the output voltage ($V_{CP}$) of the charge pump 12 can occur, and the output voltage ($V_{CS}$) may provide too much power in the burst mode. Further, an overly long suppression time may affect a current ripple of the power switch.

SUMMARY OF THE DISCLOSURE

A conventional overcurrent protection approach cannot solve all the problems caused by an overcurrent in a circuit. For example, when the overcurrent protection approach is performed in a burst mode, ripples may occur at a voltage end due to too large an output power. Therefore, a PWM-based (pulse width modulation-based) overcurrent protection circuit and an operating method for the same are provided in the present disclosure. In the PWM-based overcurrent protection circuit, a pulse width in every duty cycle of a charge pump is adjusted for modulating a current flowing through a power switch, so as to suppress the overcurrent. Accordingly, an output voltage ripple can be effectively prevented.

According to one embodiment of the present disclosure, the operating method for the PWM-based overcurrent protection circuit generally detects the overcurrent flowing through the power-switch circuit according to a load at an output end of the power-switch circuit. The load can be obtained from an output voltage of the power-switch circuit. When the overcurrent is detected, a duty-cycle width of a charge pump of the power-switch circuit can be controlled by a pulse-width-modulation circuit. A voltage outputted to the power-switch circuit by the charge pump can be suppressed by adjusting the duty-cycle width, thereby correcting the output voltage of the power-switch circuit. Accordingly, the overcurrent can be suppressed.

Further, the power-switch circuit is connected to a load-detection circuit that can determine if the overcurrent occurs according to the load at the output end of the power-switch circuit.

Still further, when the overcurrent is detected, the load-detection circuit generates an overcurrent protection voltage according to which the pulse-width-modulation circuit adjusts a clock-voltage signal outputted to the charge pump. The duty-cycle width of the output voltage of the charge pump can thereby be controlled.

Preferably, the pulse-width-modulation circuit dynamically adjusts the clock-voltage signal according to the overcurrent protection voltage so as to dynamically control the duty-cycle width of the voltage outputted by the charge pump. For example, under a certain circumstance, the pulse-width-modulation circuit dynamically reduces the duty-cycle width of the charge pump to a specific ratio, e.g., 50%, of an original duty-cycle width.

Further, the method can be applicable to a USB Type-C, and the power-switch circuit is a switching circuit of a control circuit thereof.

The method operated in the PWM-based overcurrent protection circuit detects the overcurrent according to the load of the power-switch circuit, and controls the duty-cycle width of the charge pump when the overcurrent is detected, so as to suppress the voltage outputted to the power-switch circuit from the charge pump. The output voltage of the power-switch circuit can therefore be corrected. Thus, the overcurrent of the power-switch circuit can be effectively suppressed.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following description and accompanying drawings.

DETAILED DESCRIPTION OF THE EXEMPLARY EMBODIMENTS

Figure 1:
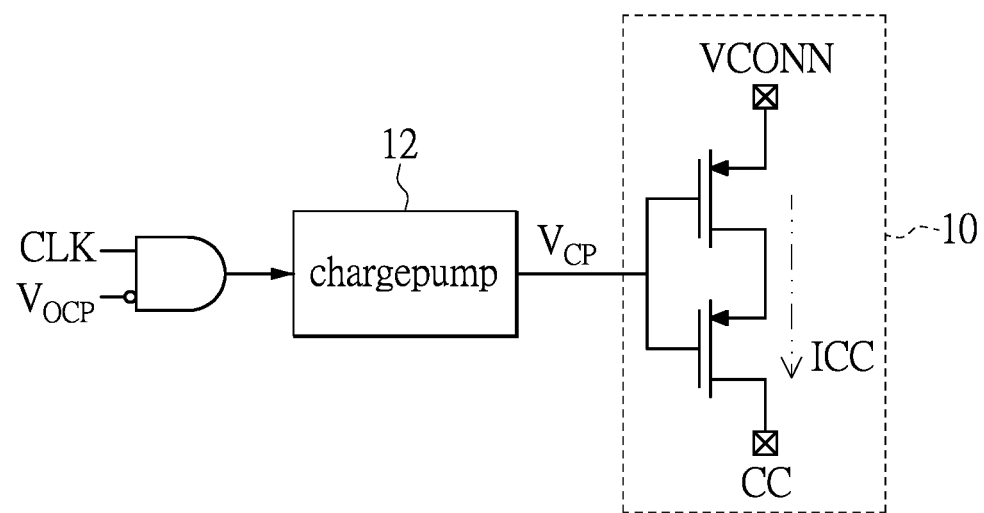
FIG. 1 is a schematic diagram depicting a power-switch circuit according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

The present disclosure relates to an overcurrent protection scheme, and more particularly to a PWM-based overcurrent protection circuit for suppressing overcurrent in a power-control circuit and an operating method for the same.

The PWM-based overcurrent protection circuit can be adapted to a power-management circuit of various electronic devices, such as the power-management circuit in a connector circuit of specific industrial specifications. The connector circuit is for example, but not limited to, a USB (universal serial bus) Type-C. The PWM-based overcurrent protection circuit can improve an overcurrent protection circuit of a power-switch circuit (VCONN switch) in the USB Type-C. The power-switch circuit is a switching circuit that is implemented by a metal oxide semi-transistor (MOS) in a control circuit of the USB Type-C.

The power-switch circuit can be used in a connector circuit of the USB Type-C. Reference is made to FIG. 1. Rather than a conventional control method that is performed in a burst mode, the present disclosure provides a control method with pulse modulation, such as a pulse width modulation (PWM) method. The PWM method can modulate a duty-cycle width of a charge pump so as to adjust a power provided in every duty cycle. A voltage outputted by the power-switch circuit can be adjusted for reducing voltage/current ripples by pulse modulation. Therefore, the power-switch circuit can output a more stable voltage.

Figure 3:
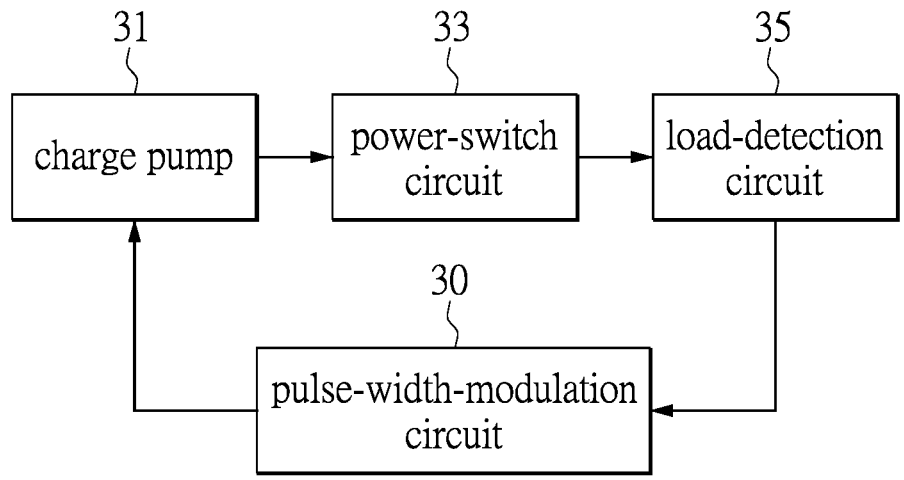
FIG. 3 is a block diagram depicting a main concept of a PWM-based overcurrent protection circuit according to one embodiment of the present disclosure.

A main concept of the PWM-based overcurrent protection circuit is shown in a schematic diagram of FIG. 3.

Figure 4:
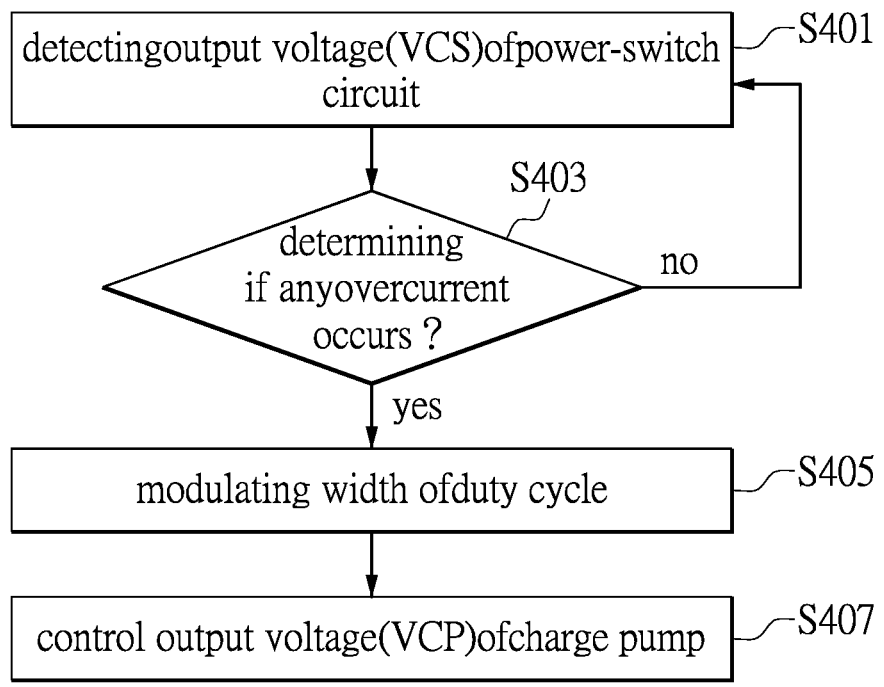
FIG. 4 shows a flow chart describing an operating method of the PWM-based overcurrent protection circuit according to one embodiment of the present disclosure.

A pulse-width-modulation circuit 30 is installed in a protection circuit of a power-switch circuit 33. The pulse-width-modulation circuit 30 is connected to a charge pump 31 and a load-detection circuit 35. The charge pump 31 supplies power for the power-switch circuit 33. A load-detection circuit 35 is installed at an output end of the power-switch circuit 33. The load-detection circuit 35 determines if overcurrent occurs according to a load at the output end of the power-switch circuit 33. Reference is next made to FIG. 4, which shows a flow chart describing the operating method of the PWM-based overcurrent protection circuit according to one embodiment of the disclosure.

In an electronic device, such as a connector, that adopts the aforementioned PWM-based overcurrent protection circuit, the power-switch circuit 33 is used to supply power to the electronic device. The load-detection circuit 35 of the power-switch circuit 33 detects an output voltage ($V_{CS}$) of the power-switch circuit 33 (step S401), and determines whether or not the overcurrent occurs according to the load at the output end (step S403).

If no overcurrent is detected, step S401 is continuously executed; otherwise, the method goes on to step S405 if an overcurrent is detected. Next, the pulse-width-modulation circuit 30 is used to modulate a duty-cycle width of the charge pump 31 of the power-switch circuit 33 so as to control an output voltage of the charge pump 31 (step S407). Thus, the output voltage of the power-switch circuit 33 is adjusted for suppressing the overcurrent.

Figure 5A:
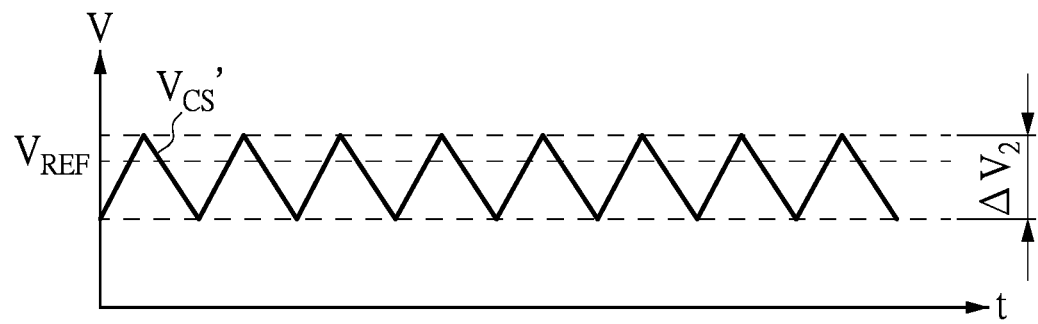
FIG. 5A is a waveform diagram showing changes of the output voltage when the overcurrent protection is performed by pulse width modulation according to one embodiment of the present disclosure.
Figure 5B:
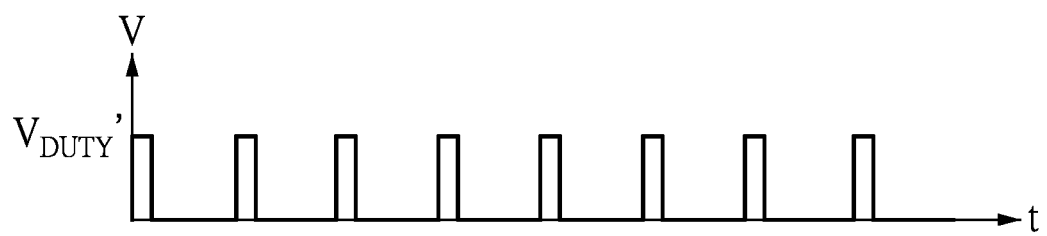
FIG. 5B is a schematic diagram showing clock signals by pulse width modulation.
Figure 5C:
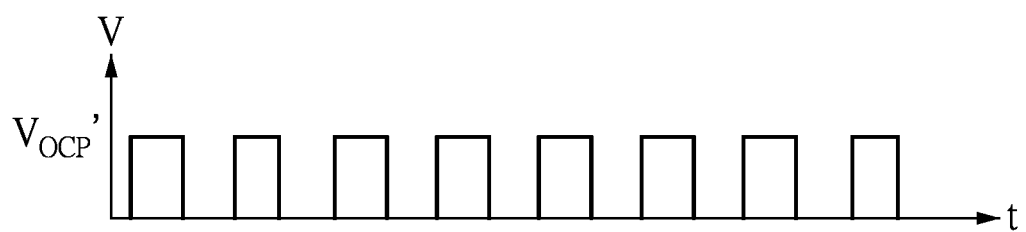
FIG. 5C is another schematic diagram showing timing of the overcurrent protection voltage.

With regard to a main concept of overcurrent protection, reference can be made to FIG. 5A which is a diagram depicting changes of the output voltage under the PWM-based overcurrent protection mechanism, FIG. 5B which is a diagram of clock signals, and FIG. 5C which is a timing diagram of the overcurrent protection voltage.

Figure 2A:
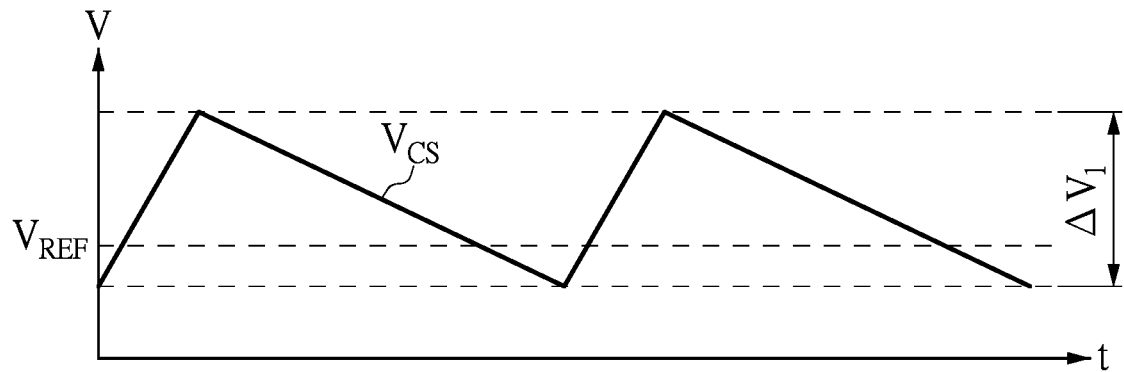
FIG. 2A is a waveform diagram showing changes of an output voltage when an overcurrent protection is performed in a burst mode.
Figure 2B:
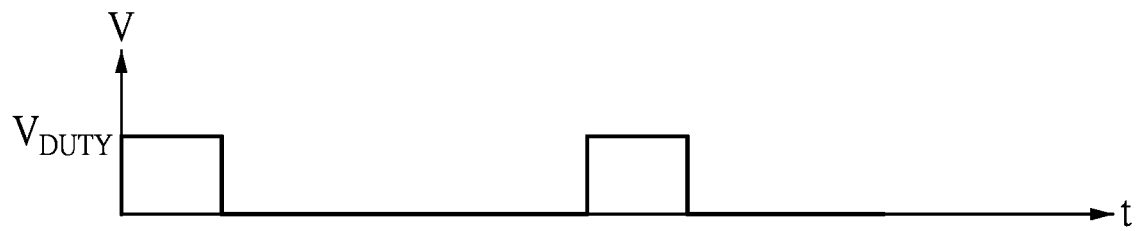
FIG. 2B is a schematic diagram showing clock signals in the burst mode.
Figure 2C:
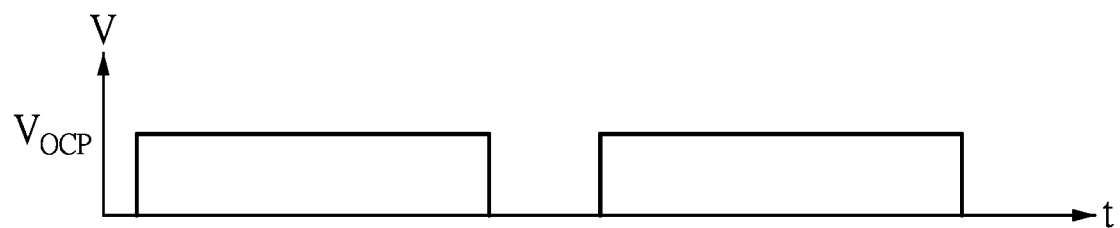
FIG. 2C is a schematic diagram showing timing of an overcurrent protection voltage.

As compared with the conventional overcurrent protection approach performed in the burst mode shown in FIG. 2A to FIG. 2C, the overcurrent protection circuit of the present disclosure adopts the pulse width modulation method. When the overcurrent occurs, the load-detection circuit generates an overcurrent protection voltage ($V_{OCP}'$) as shown in FIG. 5C for the pulse-width-modulation circuit. Therefore, the pulse-width-modulation circuit accordingly adjusts a clock-voltage signal ($V_{DUTY}'$, FIG. 5B) to control the duty-cycle width of the output voltage of the charge pump.

In other words, the duty cycle of the charge pump can be adjusted to a ratio in every clock by modulating the voltage-voltage signal ($V_{DUTY}'$) provided to the charge pump of the power-switch circuit. Accordingly, the charge pump can output periodic voltages to the power-switch circuit in every duty cycle in order to prevent that the voltage outputted from the charge pump to the power-switch circuit is improperly reduced due to too long a cycle. Therefore, the PWM-based overcurrent protection circuit allows the power-switch circuit to output a voltage ($V_{CS}'$) shown in FIG. 5A, in which $V_{REF}$ is a reference voltage provided for the circuit. The waveform diagram shown in FIG. 5A shows that the overcurrent can be effectively reduced and a correction drop is $\Delta V_2$.

For example, if the current flowing through the power-switch circuit is suppressed within a certain range of a rated current, the clock-voltage signal ($V_{DUTY}'$) outputted by the pulse-width-modulation circuit is 50% of its original value. Thus, the efficiency of the charge pump can be maximized.

Figure 6:
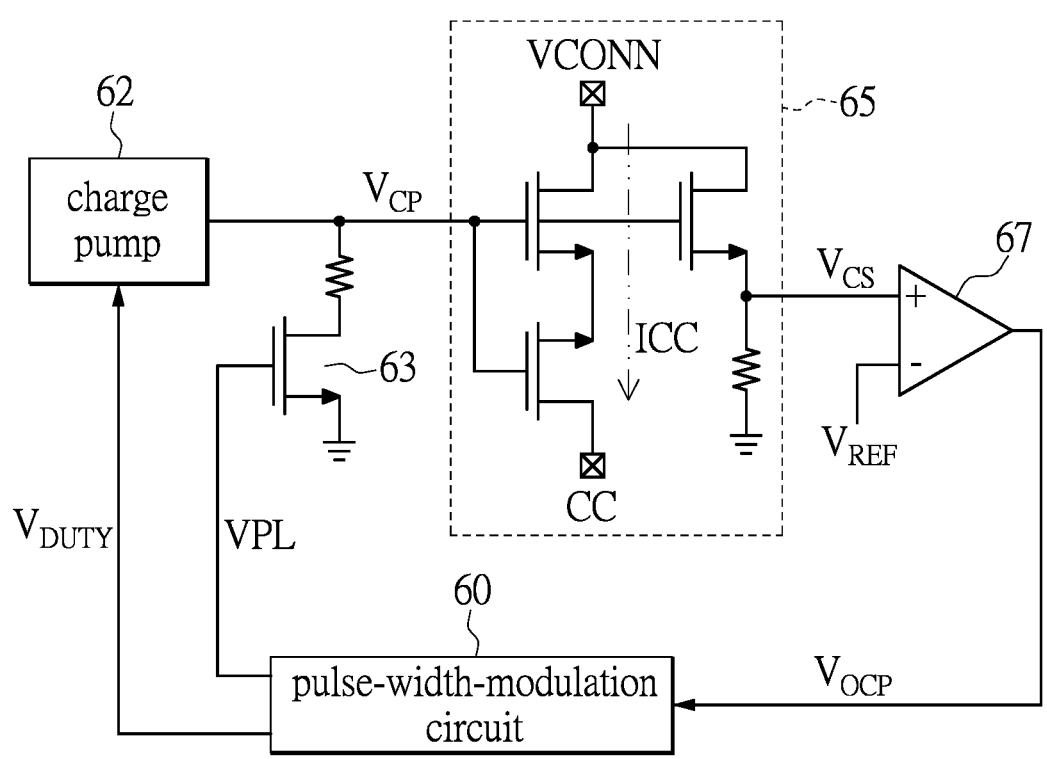
FIG. 6 is a schematic diagram depicting the PWM-based overcurrent protection circuit according to one embodiment of the present disclosure.

FIG. 6 is a schematic diagram depicting a PWM-based overcurrent protection circuit according to one embodiment of the disclosure.

A power-switch circuit 65 is shown in the diagram. With a power switch in the control circuit of the USB Type-C as an example, by measuring the output voltage ($V_{CS}$) of the power switch, it can be determined if too large a current (ICC) occurs between the power-source end (VCONN) and the common collector (CC).

The power-switch circuit 65 supplies a voltage ($V_{CP}$) via its charge pump 62, and the power-switch circuit 65 also generates the output voltage ($V_{CS}$) during operation. A load-detection circuit 67 is installed at an output end of the power-switch circuit 65. The load-detection circuit 67 is able to detect the overcurrent according to a load at the output end of the power-switch circuit 65 as compared with a reference voltage ($V_{REF}$). For suppressing the overcurrent, a pulse-width-modulation circuit 60 generates a clock-voltage signal ($V_{DUTY}$) according to an overcurrent protection voltage ($V_{OCP}$) generated by the load-detection circuit 67 so as to modulate the duty-cycle width of the charge pump 62.

The charge pump 62 outputs the voltage ($V_{CP}$) to the power-switch circuit 65 according to the clock-voltage signal ($V_{DUTY}$). If any overcurrent occurs, the load-detection circuit 67 generates the overcurrent protection voltage ($V_{OCP}$) to trigger the pulse-width-modulation circuit 60 to start operating. The clock-voltage signal ($V_{DUTY}$) is referred to modulate the duty-cycle width of the charge pump 62. On the other hand, a voltage-drop circuit 63 of the control circuit can be controlled to be turned on or off according to a pulse signal (VPL). Accordingly, the voltage ($V_{CP}$) outputted to the power-switch circuit 65 can be adjusted. The output voltage ($V_{CS}$) of the power-switch circuit 65 can be corrected by suppressing the voltage ($V_{CP}$) outputted by the charge pump 62 to the power-switch circuit 65.

In one embodiment, the pulse-width-modulation circuit 60 dynamically adjusts the clock-voltage signal ($V_{DUTY}$) that is configured to be outputted to the charge pump 62 according to the overcurrent protection voltage ($V_{OCP}$). Therefore, the duty-cycle width of the voltage outputted by the charge pump 62 can be dynamically controlled. That is, the pulse-width-modulation circuit 60 can dynamically reduce the duty-cycle width of the charge pump 62 to a specific ratio of an original duty-cycle width according to the overcurrent protection voltage ($V_{OCP}$).

Figure 7:
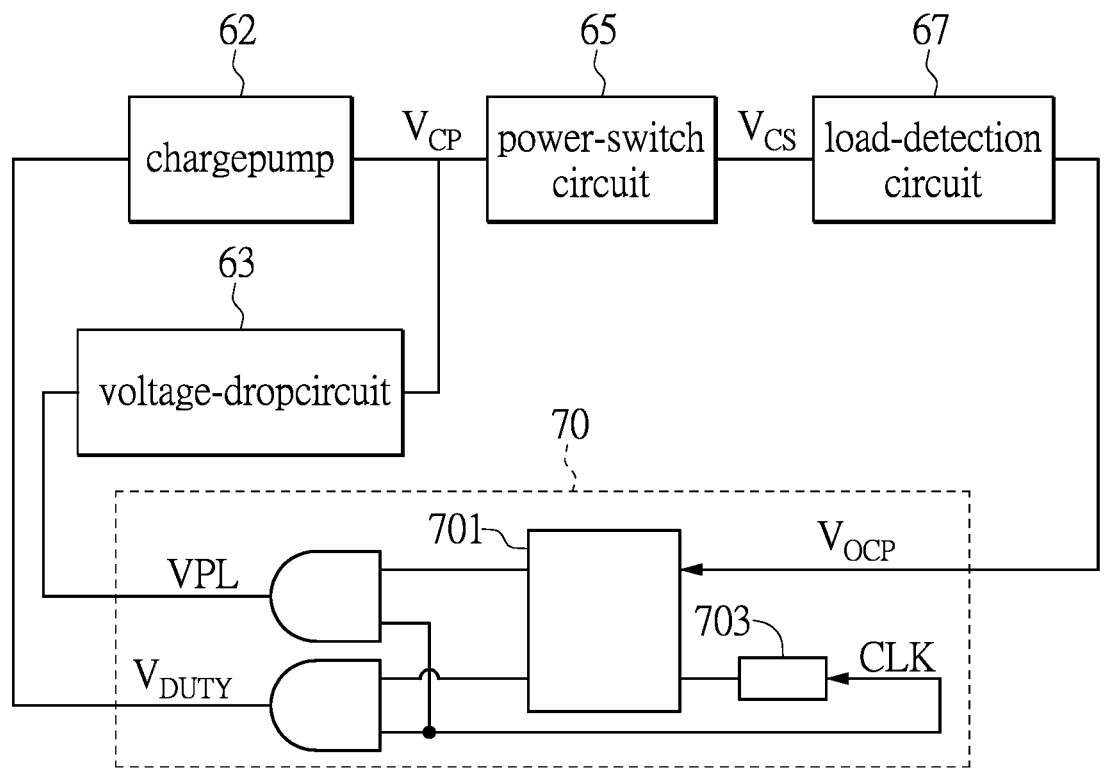
FIG. 7 is another schematic diagram depicting the PWM-based overcurrent protection circuit according to one embodiment of the present disclosure.

Reference is made to FIG. 7, which is another schematic diagram depicting the PWM-based overcurrent protection circuit according to one embodiment of the present disclosure. A configuration of the pulse-width-modulation circuit 70 is schematically shown in the diagram. A flip-flop (FF) 701 of the pulse-width-modulation circuit 70 includes two inputs and two outputs that are used to process two kinds of input signals. Two kinds of output signals are appropriately generated based on the conditions of the two kinds of input signals. An adder is also included to generate the pulse signal (VPL) provided to the voltage-drop circuit 63 and the clock-voltage signal ($V_{DUTY}$) provided to the charge pump 62.

Under a normal operation, one end of the pulse-width-modulation circuit 70 receives the overcurrent protection voltage ($V_{OCP}$) that is generated by the load-detection circuit 67 according to a detection result of overcurrent. At the same time, a signal generated by a trigger 703 according to a clock signal (CLK) is referred to, so as to generate the pulse signal (VPL) and the clock-voltage signal ($V_{DUTY}$) by the flip flop 701. The pulse signal (VPL) and the clock-voltage signal ($V_{DUTY}$) are used to suppress the voltage ($V_{CP}$) outputted to the power-switch circuit 65 by the charge pump 62, so as to adjust the output voltage ($V_{CS}$).

In conclusion, according to the above embodiments of the PWM-based overcurrent protection circuit and the operating method, a main concept of overcurrent protection is that the duty-cycle width of the charge pump that provides power can be modulated according to a load of the power switch. While a pulse width is used for modulating the duty cycle of the charge pump to reduce the output voltage ripple of the charge pump or the current ripple of the switch circuit, the PWM-based overcurrent protection circuit can also output a more stable voltage.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A pulse width modulation-based (PWM-based) overcurrent protection circuit, comprising:
   a pulse-width-modulation circuit, connected to a charge pump and a load-detection circuit, wherein both the charge pump and the load-detection circuit are connected to a power-switch circuit; wherein the charge pump outputs a voltage to the power-switch circuit according to a clock-voltage signal; wherein the load-detection circuit detects an overcurrent flowing through the power-switch circuit according to a load at an output end of the power-switch circuit;
   wherein, when the load-detection circuit detects the overcurrent, the load-detection circuit generates an overcurrent protection voltage and the pulse-width-modulation circuit dynamically adjusts the clock-voltage signal according to the overcurrent protection voltage and dynamically controls a duty-cycle width of the voltage outputted by the charge pump, so as to suppress the voltage outputted to the power-switch circuit by the charge pump, and accordingly correct an output voltage from the power-switch circuit.

2. The PWM-based overcurrent protection circuit according to claim 1, wherein the power-switch circuit is a switching circuit of a control circuit of a USB Type-C.

3. The PWM-based overcurrent protection circuit according to claim 1, wherein the pulse-width-modulation circuit dynamically reduces the duty-cycle width of the charge pump to a specific ratio of an original duty-cycle width.

4. The PWM-based overcurrent protection circuit according to claim 3, wherein the power-switch circuit is a switching circuit of a control circuit of a USB Type-C.

5. The PWM-based overcurrent protection circuit according to claim 1, wherein the load-detection circuit compares a load of the power-switch circuit with a reference voltage, so as to detect the overcurrent.

6. The PWM-based overcurrent protection circuit according to claim 5, wherein the power-switch circuit is a switching circuit of a control circuit of a USB Type-C.

7. An operating method for a pulse width modulation-based (PWM-based) overcurrent protection circuit, comprising:
   detecting, by a load-detection circuit, an overcurrent flowing through a power-switch circuit that is connected with the load-detection circuit according to a load at an output end of the power-switch circuit;
   generating, by the load-detection circuit, an overcurrent protection voltage when the overcurrent is detected;
   dynamically adjusting, by a pulse-width-modulation circuit, a clock-voltage signal according to the overcurrent protection voltage; and
   dynamically controlling, by a pulse-width-modulation circuit, a duty-cycle width of a voltage outputted by a charge pump when the overcurrent is detected, so as to suppress the voltage outputted by the charge pump to the power-switch circuit, and accordingly correct an output voltage from the power-switch circuit for suppressing the overcurrent.

8. The operating method according to claim 7, wherein the power-switch circuit is a switching circuit of a control circuit of a USB Type-C.

9. The operating method according to claim 7, wherein the pulse-width-modulation circuit dynamically reduces the duty-cycle width of the charge pump to a specific ratio of an original duty-cycle width.

10. The operating method according to claim 9, wherein the power-switch circuit is a switching circuit of a control circuit of a USB Type-C.

* * * * *